May 17, 1966 N. GREGORY 3,252,108

LINEARIZED FREQUENCY MODULATED CRYSTAL OSCILLATORS

Filed April 29, 1963 2 Sheets-Sheet 1

NICHOLAS GREGORY
INVENTOR.

BY Robert Shaw

ATTORNEY

LINEARIZED FREQUENCY MODULATED CRYSTAL OSCILLATORS

Filed April 29, 1963

2 Sheets-Sheet 2

NICHOLAS GREGORY
INVENTOR.

BY Robert Shaw

ATTORNEY

United States Patent Office 3,252,108

Patented May 17, 1966

3,252,108
LINEARIZED FREQUENCY MODULATED CRYSTAL OSCILLATORS

Nicholas Gregory, 40 Haggetts Pond Road, Andover, Mass.

Filed Apr. 29, 1963, Ser. No. 276,407
15 Claims. (Cl. 331—65)

The present invention relates to frequency modulation and multiplication apparatus for radio frequency signals and, more particularly, to frequency modulation and multiplication apparatus embodying voltage-variable capacitance means and crystal means in series-combination.

There are many requirements for a precise radio-frequency signal which may be frequency modulated and, often, multiplied as for transmission. This is common in broadcast apparatus and the like, but, as hereinafter discussed, other uses may be made of such a precise frequency-modulated signal. A crystal is used to maintain the signal frequency substantially constant in the oscillator circuit of such apparatus, the crystal being chosen because of its stable frequency characteristics. This stability, however, makes appreciable linear shifting of frequency difficult in crystal-controlled oscillator circuits. While it is not difficult to shift the frequency of a crystal-controlled oscillator by 0.01 percent, it is difficult to effect a shift of ±0.1 to ±0.2 percent in a linear and predictable fashion.

An equivalent circuit of the crystal of a crystal-controlled oscillator includes a resistance, capacitance and inductance in series and a capacitance in parallel therewith. Frequency-modulation of such an oscillator has been effected by changing the reactance of the oscillatory circuit including the crystal by use, for example, of reactance tubes, variable inductances and/or variable capacitance elements, the result being effected often by either changing the reactance of the elements in the circuit or by changing the effect of such elements. In such instances the Q or quality factor of the crystal is reduced by placing other elements across the crystal, thus making oscillation dependent to some extent upon circuit elements having less stability than the crystal and thus lessening frequency stability. Further, these circuits require a fairly large number of reactance components, and, even so, they do not result in the precise modulation required for some applications. Furthermore, other circuit elements in addition to those required for frequency modulation are needed to multiply the modulated signal.

It is, therefore, an object of the present invention to provide a crystal-controlled oscillator which may be frequency modulated in a linear and predictable fashion and in which the modulated signal may be multiplied, while employing, neverthless, a minimum of circuit elements.

Still another object is to provide a crystal-controlled oscillator which may be used in connection with broadcase apparatus, but which is adapted also for use in connection with precision measuring devices wherein a variable to-be-measured modulates the oscillator a predetermined amount and the modulation is interpreted to determine the physical characteristics of the variable. Thus the measured value of the physical characteristics of the variable is evaluated with reference to the very precise characteristics of a crystal.

A further object is to provide modulation of a crystal-controlled oscillator, for example, ±0.1 to ±0.2 percent of the operating frequency in a predictable manner.

A still further object is to provide the said modulation without substantially reducing the quality factor of the crystal.

Other and still further objects will be evident in the description to follow and will be particularly pointed out in the appended claims.

Generally and by way of summary, the objects of the invention are attained in an electric circuit operable to oscillate at a frequency, that comprises, a crystal to control the frequency of oscillation, the crystal reactance at varying frequency being non-linear within a predetermined frequency range. A voltage-variable capacitance connected in series with the crystal is operable to vary the frequency of oscillation within the predetermined range. The voltage-variable capacitance has a reactance which is non-linear at varying reverse-bias voltage and means is provided to apply a quiescent reverse bias to the voltage-variable capacitance. Modulator means is provided to introduce a modulator voltage across the voltage-variagle capacitance and thereby modulate the frequency of oscillation within the said frequency range. A quiescent point is established by the reverse-bias means at which the sum of the reactance of the crystal and the voltage-variable capacitance in combination is substantially linear within the said frequency range, the respective reactances of the crystal and voltage-variable capacitance being matched to enable such linearity. An output is taken across the voltage-variable capacitance. The output includes the fundamental of the said frequency of oscillation and harmonic multiples thereof. Suitable filters may be provided in the output circuit to allow passage of desired frequencies while blocking other unwanted frequencies.

The invention will now be explained in connection with the accompanying drawings in which FIG. 1 is a simplified schematic circuit diagram partially in block diagram form of an embodiment of the present invention;

Figure 1:
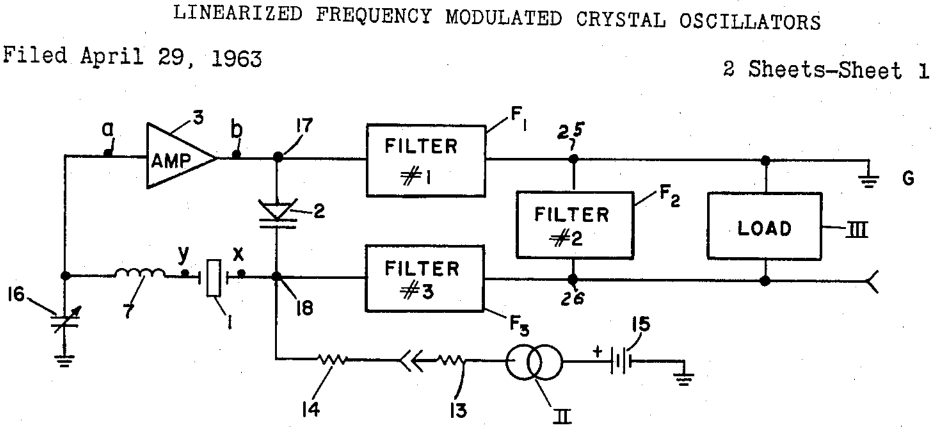
Figures 2A, 2B, 2C, 5, 6, 8:
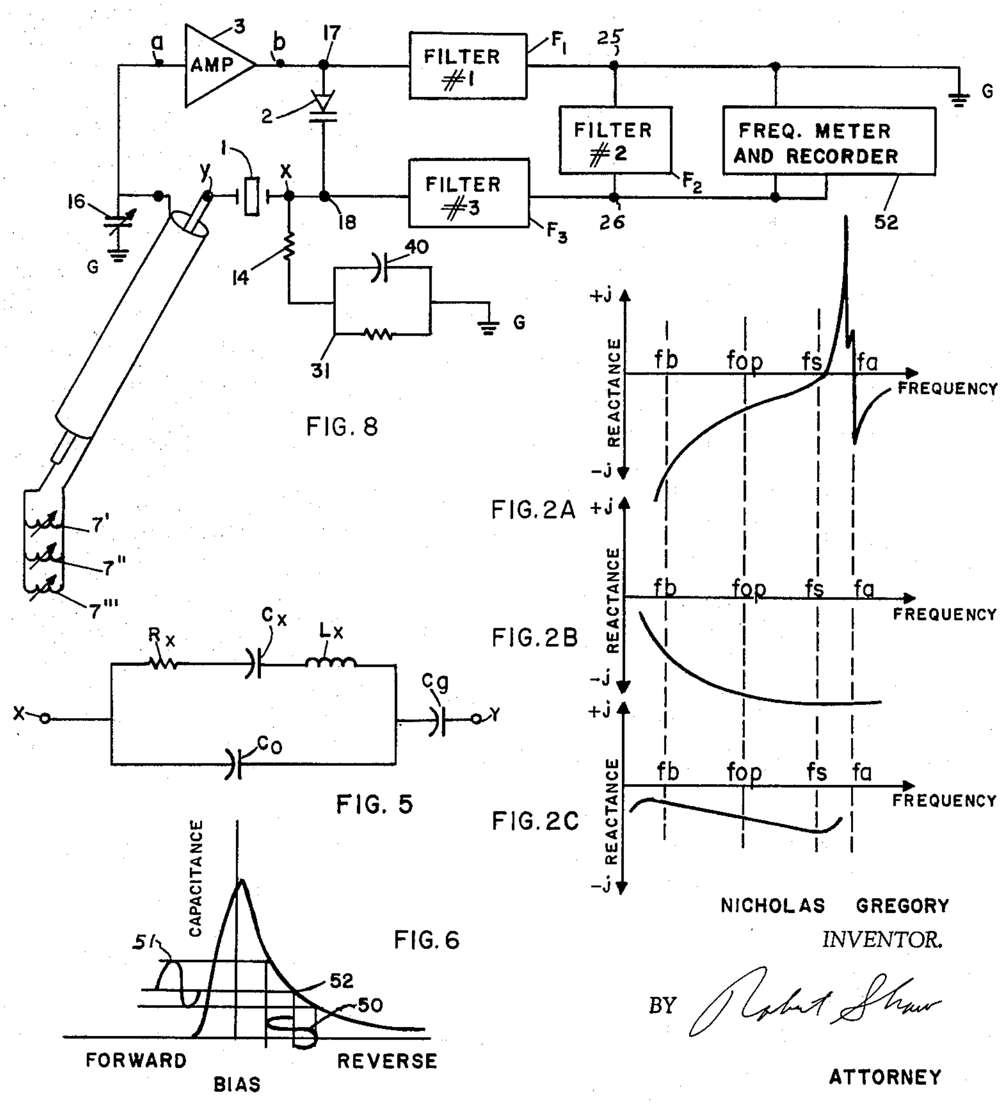
FIG. 2A is a graph of the reactance of a crystal as a function of frequency, the graph being non-scalar and expanded in the vicinity of the natural frequency of the crystal.
FIG. 2B is a similar non-scalar graph for a voltage-variable capacitance when the capacitance is operated in combination with the crystal of FIG. 1 and a reverse-bias voltage is applied across the voltage-variable capacitance.
FIG. 2C is a graph of the sum of the reactances of FIGS. 2A and 2B and the slope is exaggerated to show reactance change.
FIG. 5 is a schematic of the equivalent circuit of a crystal.
FIG. 6 is a graph of capacitance of a voltage-variable capacitance as a function of the bias voltage applied thereto.

Referring to FIG. 1 an electric circuit or oscillator of the present invention is shown in schematic form having a crystal 1 to control the frequency of oscillation of the circuit. The crystal reactance at varying frequency, as shown in FIG. 2A, is non-linear within a predetermined frequency range, for example between $f_b$ and $f_s$. A voltage-variable capacitance or varactor diode 2, which is operable to vary the frequency of oscillation within the predetermined range, is connected in series with the crystal 1. The voltage-variable capacitance 2 has a reactance which is non-linear at varying reverse-bias voltage, as shown in FIG. 6. The crystal 1, as later explained, is chosen to match the voltage-variable capacitance 2 so that the relationship shown in FIGS. 2A and 2B is realized. Thus, a properly matched crystal and a voltage-variable capacitance connected in series may be adjusted to introduce a substantially linear sum reactance at varying frequency of oscillation as shown in FIG. 2C, and the reactances may be matched to give a sum reactance of better than one percent non-linearity over the frequency range of interest. Means, which may be the battery shown at 15, is provided to apply a quiescent reverse-bias voltage to the voltage-variable capacitance 2. The reverse bias so applied is operable to establish a quiescent point on the characteristic curve of the voltage-variable capacitance 2 (see FIG. 6) at which the sum of the reactances of the crystal 1 and the voltage-variable capacitance 2, acting in combination, is substantially linear within the frequency range between $f_b$ and $f_s$, it being understood that another range of frequency operation may be chosen depending upon the particular application. It may be seen, furthermore, that the choice of the crystal is not sharply critical since some measure of matching of the reactances may be effected by the proper choice of the quiescent point which, in turn, is determined for any particular voltage-variable capacitance by the reverse bias.

The voltage-variable capacitance 2 alone is voltage sensitive, as before explained, and not frequency sensitive. The reactance of the voltage-variable capacitance 2 is non-linear as a function of frequency only when associated with another element, as the crystal 1, which in the illustrated circuits, effects changes in frequency as a function of the reverse-bias voltage upon the voltage-variable capacitance 2. By proper choice of the crystal 1 to match a particular voltage-variable capacitance 2, a change in capacitance that may be rendered by a modulator voltage will effect a change in the frequency of oscillation. In a sense, therefore, the reactance of the voltage-variable capacitance 2 varies with frequency, as shown in FIG. 2B. Presently used voltage-variable capacitances are made to have non-linear characteristic curves in which the capacitance varies either as the reverse square of the reverse-bias voltage or as the square root of the reverse-bias voltage. A modulator voltage that may be, for example, the sinusoidal voltage shown at 50 in FIG. 6 applied across the non-linear voltage-variable capacitance 2 will produce a capacitance change which differs at each point along the reverse-bias curve about the quiescent point 52, as shown by the distorted wave 51. By proper choice of crystal 1, however, the net effect on the crystal-voltage-variable-capacitance combination will be sinusoidal since the sum of the reactances of the combination is linear.

Matching of a particular voltage-variable capacitance 2 may be made by referring to the characteristic curve of the voltage-variable capacitance and specifying the electrical characteristics of a crystal to match the same. It is in order, therefore, briefly, to discuss the crystal. The equivalent circuit of a crystal is shown in FIG. 5 wherein $R_x$, $C_x$, and $L_x$ are respectively the series or motional arm resistance, motion arm capacitance and motional arm inductance. $C_0$ is the capacitance between the crystal mounting plates and $C_g$ (which is generally a negligible factor) is the capacitance between the crystal and its mounting plates. The characteristic curve of reactance as a function of frequency for any crystal as shown, for example, in FIG. 2A is determined by the values of $L_x$, $C_x$, etc. for the particular crystal. The spacing between series resonance, shown at $f_s$ in FIG. 2A, and parallel resonance, shown at $f_a$, is a measure of the total characteristic reactance between $f_a$ and $f_b$ of a particular crystal. Thus by establishing points $f_s$ and $f_a$ for the particular crystal, the approximate shape of the crystal reactance curve between $f_s$ and $f_b$ can be predicted. To match the characteristic curve of the voltage-variable capacitance 2 with which the crystal is to be used, $f_a$ and $f_s$ are made to have required values by the proper choice of the crystal 1 with reference to the required physical dimensions, mounting, etc. to give the desired values of $L_x$, $C_x$, etc.

The voltage-variable capacitance 2 presents a non-linear reactance to the frequency of oscillation of the electric circuit as well as to the modulator voltage. If, therefore, the electric circuit is made to oscillate, for example, at a particular sinusoidal frequency, this frequency will drive the voltage-variable capacitance 2 and a voltage wave taken across the voltage-variable capacitance 2 (point 17 to point 18) will, because of this non-linearity, contain the fundamental of the frequency of oscillation, but will also contain harmonic multiples thereof. Thus, the voltage-variable capacitance 2 in the present invention may be used as a means through which the said frequency of oscillation is modulated and, further, as a means for multiplying the frequency of oscillation.

An oscillator embodying the frequency modulation and multiplication concept herein described, therefore, requires a minimal number of components. An operable frequency modulated oscillator and multiplier, as shown in FIG. 1, together with an output circuit for use therewith may be fabricated which is contained in about one cubic inch volume. Miniaturization of the oscillator thus presents no problem and, further, the elements thereof may be molded in plastic or the like. Molding enables use of the oscillator in applications wherein an impact is applied thereto, and, further, the elements in a molded unit may be placed close together and in fixed relationship, which facilitates temperature compensation efforts.

Figure 7:
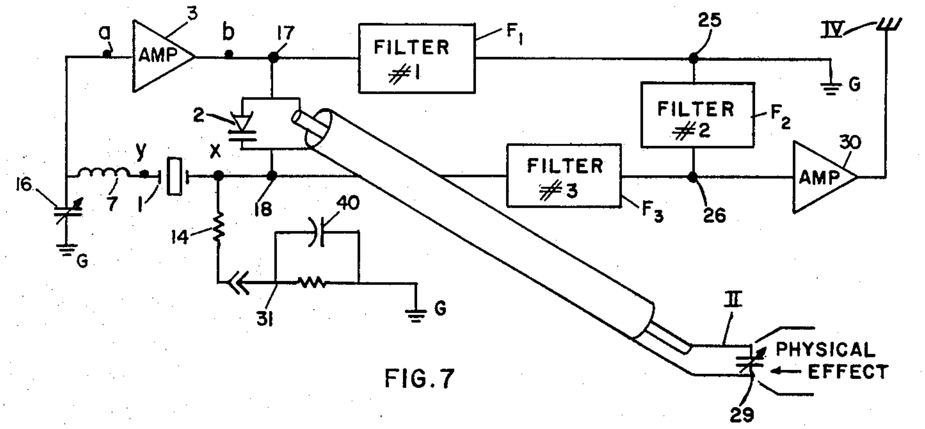
FIGS. 7 and 8 are modifications of the circuit shown schematically in FIG. 1.

The oscillator has great flexibility, as will be evident in the detailed description hereinafter. Briefly, however, the oscillator may be used in connection with equipment wherein the schematically represented modulator means, shown at II in various forms in the figures, is a microphone. A voice or other signal fed into the microphone introduces a modulator voltage across the voltage-variable capacitance 2 thereby to modulate the frequency of oscillation within the said frequency range in the manner previously discussed, and a modulated fundamental or multiple of the oscillator frequency is passed to a load III. The load III may be an amplifier 30, as shown in FIG. 7, associated with an antenna IV from which the modulated radio frequency signal is transmitted. In view of the linearity of the oscillator impedance, a faithful reproduction of the voice or other signal is effected. The modulator means II may, on the other hand, be a variable impedance element that varies as a function of temperature or as a function of some other variable physical-effect-to-be-measured or compared. In such case, modulation of the oscillator due to changes in the impedance element may be transmitted in the manner just described and interpreted at a remote point. Or the load III may be a detector instrument 52, as shown in FIG. 8, calibrated to translate changes in frequency to meaningful values of the physical effect measured.

A more detailed discussion of the circuit operation will now be made with reference first to FIG. 1. An amplifier 3 is shown having an input *a* and an output *b*. A feedback path between *a* and *b* includes the voltage-variable capacitance 2 which is connected to the output *b* at one terminal thereof and to one terminal of the crystal 1, shown at X, at the other terminal. The other terminal of the crystal 1, shown at Y, is connected to an inductance 7 and thence to the input *a*, thus completing the feedback path. A small alternating-current signal appearing, for example, at the input *a* is amplified and shifted in phase by approximately 180 degrees by the amplifier 3. The amplified signal passes from the output *b* through the feedback path wherein the phase is shifted a further 180 degrees for a total 360 degree shift. If the gain in the circuit from the input *a* through the amplifier and feedback path back to *a* is unity or greater and the elements of the circuit are chosen to produce the 360 degree shift of phase, then the circuit will oscillate at a frequency which is controlled by the crystal 1. While the crystal 1 controls the frequency of oscillation, the frequency is, nevertheless, subject to slight modification depending on the crystal. A variable capacitance 16 connected, for example, betwen the input *a* and ground G may be used to make fine frequency adjustments of the circuit of $\pm0.005$ percent to establish exactly the desired frequency of oscillation. (Ground is used here to denote chassis or common connection in addition to actual earthing.) Further shifting of the frequency of oscillation may be effected, as for modulation thereof, by modulating the capacitance of the voltage-variable capacitance 2 as previously mentioned. It has been found for purposes of the present invention that the frequency of oscillation may be modulated in this manner $\pm0.2$ percent in a linear and predictable fashion. Linearity and range are of great importance especially in broadcast applications while predictability is particularly important for instrumentation applications to be discussed hereinafter.

An output voltage is withdrawn across the voltage-variable capacitance 2. The output circuit includes a filter $F_1$ connected at one terminal thereof to the point 17 and at the other terminal to a filter $F_2$ and to ground G. The filter $F_2$ in turn is connected to a filter $F_3$ which is connected to the point 18, the load III being connected across $F_2$ between points 25 and 26. By proper choice of the filters $F_1$, and $F_2$ and $F_3$, a desired frequency or band of frequencies may be applied to the load III.

The modulator circuit is shown having a source resistance 13 in series with modulator means II, the resistance 13 being connected through a resistance 14 to the point X. The modulator means II may be a signal generator, as depicted schematically in FIG. 1, but other types of modulators may be used equally well. For example, the modulator II connected in the circuit at *c* in FIG. 3 may be a variable impedance as the variable resistance shown at 27 in FIG. 4B, or a plurality of temperature sensitive resistances 27, 28, etc. in parallel or in series, and the resistances may be switched in or out of the modulator circuit to enable multiple successive modulations of the oscillator circuit. The flexibility of the circuit of the present invention is further illustrated by additional modulator means that may be used, as a variable inductance 7′ in FIG. 8 or a variable capacitance 29 in FIG. 7 or a potentiometer 31′ in FIG. 4A or the bridge circuit in FIG. 4D. A further modulator means II is shown in FIG. 4C comprising a potentiometer-type transducer 32 having two end taps 33 and 34, respectively, and a movable tap 35, the modulator voltage being taken across the end tap 34 and the movable tap 35. A reference voltage is connected across the end taps 33 and 34. The reference voltage may be supplied by a battery or it may be derived by self-biasing of the voltage-variable capacitance 2 in a manner now to be explained with reference to FIG. 3.

Figures 3, 4A, 4B, 4D:
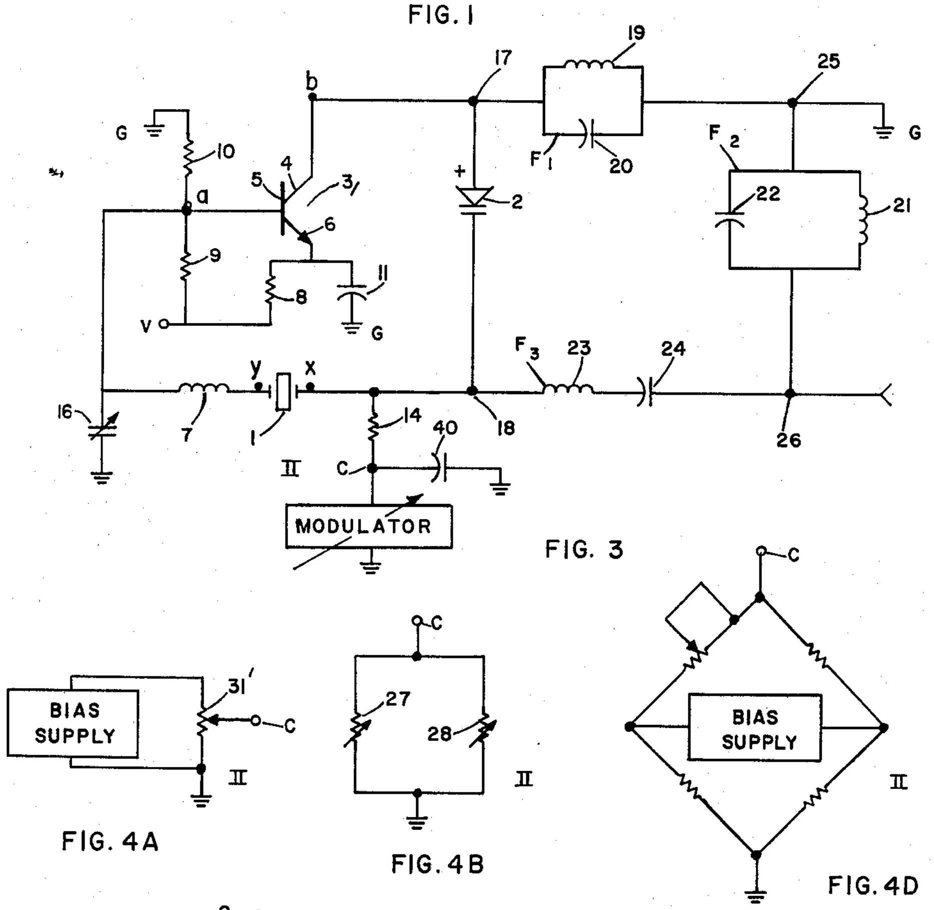
FIG. 3 is a more detailed schematic circuit diagram than the circuit of FIG. 1 and shows a modulator circuit in block form.
FIGS. 4A–4D illustrate proposed modulator circuits that may be used in connection with the circuit of FIG. 3.
Figure 4C:
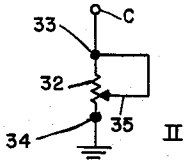

If the circuit shown in FIG. 3 is operated near the zero point of the voltage-variable capacitance 2 on the reverse-bias side thereof in FIG. 6, the voltage-variable capacitance 2 acts as a peak detector of the negative peaks of the frequency of oscillation. When the negative peaks exceed the barrier potential of the voltage-variable capacitance 2 on the forward side thereof, a self-biasing of the voltage-variable capacitance 2 is effected. The rectified peaks are filtered by a capacitance 40. Thus with appropriate elements and operating levels of the electric circuit, the battery 15 need not be used since a reverse-bias voltage is derived by self-biasing of the voltage-variable capacitance 2. In addition to acting to bias the voltage-variable capacitance 2, the said self-biasing voltage may, with appropriate values of circuit elements, be the reference voltage mentioned above in connection with FIG. 4C. The derived reverse-bias voltage is very constant and eliminates the need for constant compensation of the reference or bias voltage as is the case when a battery is used.

In FIG. 3, the amplifier 3 is shown comprising a transistor having an emitter 6, a base 5 and a collector 4. A negative direct-current voltage V is connected to the emitter 6 through an emitter-biasing resistance 8, the emitter being connected to ground G through a by-pass capacitance 11. The voltage V is further connected to ground through a voltage divider consisting of series resistances 9 and 10, the base 5 being connected at *a* to the common lead of these resistances. The other elements of the oscillator circuit have already been described in connection with FIG. 1. In the output circuit the filter $F_1$ may be an inductance 19 and a capacitance 20 in parallel; the filter $F_2$ may be an inductance 21 and a capacitance 22 in parallel; and the filter $F_3$ may be an inductance 23 and a capacitance 24 in series. The filters, as previously discussed, may be chosen to pass a particular frequency or band of frequencies which may include the fundamental of the frequency of oscillation and/or harmonic multiples thereof. The harmonics, as has been mentioned, are generated by the non-linearity of the voltage-variable capacitance 2. The harmonic content of the output may be enhanced by operating the voltage-variable capacitance 2 at a point of great non-linearity, by proper choice of reverse bias, with a high level of oscillator drive. Still greater harmonic output may be obtained by peak detecting negative fundamental oscillator peaks across the voltage-variable capacitance 2, which produces high order harmonic content. In this manner usable outputs greater than the tenth harmonic have been obtained. By making use of idler currents, for example the second, third, fourth, fifth harmonics, etc., in the loop comprising the filter $F_1$ to ground, through the capacitance 40, the resistance 14 and the voltage-variable capacitance 2, a mixing is effected which increases the level of the desired harmonic.

Brief mention has previously been made to use of the present circuit in connection with a detector instrument. A more complete explanation will now be made with reference to FIG. 8 wherein the detector instrument is illustrated as a frequency meter and recorder 52. The modulator circuit of FIG. 1 is replaced by an RC circuit 31 and the modulator means II is shown as the variable inductance 7′. Changes in the value of the inductance 7′ will effect changes in the frequency of oscillation, which changes or modulations, in turn, are conducted to the meter 52. The inductance 7′ may be variable as a function of a physical-effect to-be-measured and the meter is appropriately calibrated to translate the changes in inductance to meaningful terms. The meter 52 may be calibrated to read, successively, a plurality of values of inductance as 7′, 7″, 7‴, etc., which may be switched in and out of the modulator circuit by appropriate switching means. It may be appreciated that the other modulator circuit arrangements previously described in connection with FIGS. 1, 3, 4A–4D and 7 may be used with equal facility with the meter 52. In those instances when the modulated signal is multiplied, a multiple of the different frequency appears at the meter 52 with resultant improvement in accuracy.

Reference has been previously made to linearity of the crystal 1 and voltage-variable capacitance 2 sum impedance at varying frequency. There are applications, however, in which a determined non-linearity of the sum impedance is desired. This might occur when, for example, a change in the resistance of an element is non-linear as a function of temperature. It may be desirable to match the resistance of such an element at various temperatures against that of an acceptable element. In this case, it is desirable that the output of the oscillator vary linearly, which dictates a slight but determinable non-linearity of the sum impedance of the crystal 1 and voltage-variable capacitance 2. In this instance, therefore, the element to-be-measured is placed at II in the modulator circuit and it is the sum impedance, as seen by the oscillator, of the crystal 1, the voltage-variable capacitance 2 and the response of the element-to-be-measured that must be linear within the said predetermined frequency range.

Further modifications of the invention will occur to those skilled in the art and all such modifications are considered to fall within the spirit and scope of the invention as defined in the appended claims.

What is claimed is:

1. In an electric circuit operable to oscillate over a predetermined frequency range, a crystal to control the frequency of oscillation in said range, the crystal reactance at varying frequency being non-linear and capacitive within said frequency range, an inductance in series with the crystal, a voltage-variable capacitance in series with the crystal and having a reactance which is non-linear at varying reverse-bias voltage, the voltage-variable capacitance being operable in combination with said crystal to vary the frequency of oscillation within the said range, means to apply a quiescent reverse-bias voltage to the voltage-variable capacitance, modulator means operable to introduce a modulator voltage across the voltage-variable capacitance and thereby modulate the said frequency of oscillation within the said frequency range, the bias means being operable to establish a quiescent point within said range about which the sum of the reactances of the crystal and the voltage-variable capacitance in combination is substantially linear over the said frequency range, and means for withdrawing an output voltage across the voltage-variable capacitance.

2. An electric circuit as claimed in claim 1 and in which the reverse-bias means is a battery.

3. An electric circuit as claimed in claim 1 and in which the reverse bias is derived by self-biasing of the voltage-variable capacitance.

4. An oscillator as claimed in claim 1 and in which means is provided to adjust for slight non-linearity of the said sum reactance.

5. In an electric circuit operable to oscillate over a predetermined frequency range, a crystal to control the frequency of oscillation in said range, the crystal reactance at varying frequency being non-linear and capacitive within said frequency range, an inductance in series with the crystal, a voltage-variable capacitance in series with the crystal and having a reactance which is non-linear at varying reverse-bias voltage, means to apply a quiescent reverse-bias voltage to the voltage-variable capacitance, modulator means operable to modulate the said frequency of oscillation within the said frequency range, the bias means being operable to establish a quiescent point within said range about which the sum of the reactances of the crystal and the voltage-variable capacitance in combination is substantially linear over the said frequency range, and means for withdrawing an output voltage across the voltage-variable capacitance.

6. In an electric circuit operable to oscillate over a predetermined frequency range, a crystal to control the frequency of oscillation in said range, the crystal reactance at varying frequency being non-linear and capacitive within said frequency range, an inductance in series with the crystal, a voltage-variable capacitance in series with the crystal and having a reactance which is non-linear at varying reverse-bias voltage, the voltage-variable capacitance being operable in combination with said crystal to vary the frequency of oscillation within the said range, means to apply a quiescent reverse-bias voltage to the voltage-variable capacitance, variable impedance modulator means operable to introduce a modulator voltage across the voltage-variable capacitance and thereby modulate the said frequency of oscillation within the said frequency range, the bias means being operable to establish a quiescent point within said range about which the sum of the reactances of the crystal and the voltage-variable capacitance in combination is substantially linear over the said frequency range, and means for withdrawing an output voltage across the voltage-variable capacitance, which output includes the said frequency of oscillation and harmonic multiples thereof.

7. An electric circuit as claimed in claim 6 and in which the variable impedance modulator means is a resistance means which varies in a predictable manner as a function of temperature to thereby modulate the said frequency of oscillation.

8. An electric circuit as claimed in claim 6 and in which the variable impedance modulator means is a variable capacitance.

9. An electric circuit as claimed in claim 5 and in which modulator means is a variable inductance.

10. An electric circuit as claimed in claim 6 and in which the variable impedance modulator means comprises a plurality of impedance elements each responsive to a physical effect, the said modulator voltage being determined by the summation of the responses.

11. In an electric circuit operable to oscillate over a predetermined frequency range, an amplifier having a feedback path, a crystal in the feedback path to control the frequency of oscillation in said range, the crystal reactance at varying frequency being non-linear and capacitive within said frequency range, an inductance in series with the crystal, a voltage-variable capacitance in series with the crystal and having a reactance which is non-linear at varying reverse-bias voltage, the voltage-variable capacitance being operable in combination with said crystal to vary the frequency of oscillation within the said range, means to apply a quiescent reverse-bias voltage to the voltage-variable capacitance, modulator means operable to modulate the said frequency of oscillation within the said frequency range, the bias means being operable to establish a quiescent point within said range about which the sum of the reactances of the crystal and the voltage-variable capacitance in combination is substantially linear over the said frequency range, and means for withdrawing an output voltage across the voltage-variable capacitance, which output includes the said frequency of oscillation and harmonic multiples thereof.

12. An electric circuit as claimed in claim 11 and in which the amplifier is a transistor having an emitter, a base and a collector and in which the said feedback path is connected between the collector and the base and a negative direct-current voltage is connected to the emitter.

13. An electric circuit as claimed in claim 11 and in which the modulator means is a variable inductance in series with the crystal.

14. In an electric circuit operable to oscillate over a predetermined frequency range, a crystal to control the frequency of oscillation in said range, the crystal reactance at varying frequency being non-linear and capacitive within said frequency range, an inductance in series with the crystal, a voltage-variable capacitance in series with the crystal and having a reactance which is non-linear at varying reverse-bias voltage, the voltage-variable capacitance being operable in combination with said crystal to vary the frequency of oscillation within the said range, means to apply a quiescent reverse-bias voltage to the voltage-variable capacitance, the bias means being operable to establish a quiescent point within said range about which the sum of the reactances of the crystal and the voltage-variable capacitance in combination is substantially linear over the said frequency range.

15. In an electric circuit operable to oscillate over a predetermined frequency range, a crystal to control the frequency of oscillation in said range, the crystal reactance at varying frequency being non-linear and capacitive within said frequency range, an inductance in series with the crystal, a voltage-variable capacitance in series with the crystal and having a reactance which is non-linear at varying reverse-bias voltage, the voltage-variable capacitance being operable in combination with said crystal to vary the frequency of oscillation within the said range, means to apply a quiescent reverse bias to the voltage-variable capacitance, modulator means operable to vary the said frequency of oscillation within the said frequency range, the modulator means having a non-linear response over its operating range, the bias means being operable to establish a quiescent point with said range about which the combination of the reactances of the crystal and the voltage-variable capacitance and the response of the modulator means is substantially linear over the said range.

References Cited by the Examiner

UNITED STATES PATENTS

| | | | |
|---|---|---|---|
| 2,755,384 | 7/1956 | Pierson et al. | 331—116 |

| | | | |
|---|---|---|---|
| 2,925,561 | 2/1960 | MacDonald | 331—158 X |
| 3,054,966 | 9/1962 | Etherington | 311—116 |
| 3,068,427 | 12/1962 | Weinberg | 332—26 X |

OTHER REFERENCES

Silverman: "Voltage Variable Silicon Capacitor." CQ, February 1961, pages 40–42—TK6540.C2.

ROY LAKE, *Primary Examiner.*

S. H. GRIMM, *Assistant Examiner.*